US005615137A

United States Patent [19]

Holzmann et al.

[11] Patent Number: 5,615,137

[45] Date of Patent: Mar. 25, 1997

[54] ON-THE-FLY MODEL CHECKING WITH PARTIAL-ORDER STATE SPACE REDUCTION

[75] Inventors: Gerard J. Holzmann, Murray Hill; Doron A. Peled, New Providence, both of N.J.

[73] Assignee: Lucent Technologies Inc., Murray Hill, N.J.

[21] Appl. No.: 667,350

[22] Filed: Jun. 21, 1996

Related U.S. Application Data

[63] Continuation of Ser. No. 252,028, Jun. 1, 1994, abandoned.

[51] Int. Cl.[6] .......... G06F 17/50

[52] U.S. Cl. .......... 364/578; 364/491

[58] Field of Search .......... 364/488, 489, 364/490, 491, 512, 578

[56] References Cited

PUBLICATIONS

"The Existence of Refinement Mappings", by M. Abadi et al., IEEE Logic in Computer Science, 3rd Annual Symposium, 1988, pp. 165–175.

"Protocol Design: Redefining the State of the Art", by G. Holzmann, IEEE Software, vol. 9, Issue 1, Jan. 1992, pp. 17–22.

"A Partial Order Approach to Branch Time Logic Model Checking", by Gerth et al., IEEE, Israel Symposium on the Theory of Computing and Systems, 1994, pp. 130–139.

R. Gopal, "Dynamic Program Slicing Based on Dependence Relations", Proceedings of the Conference on Software Maintenance 1991, Oct. 17, 1991, pp. 191–200.

"Petri Net Approach to Correctness Checking on Changing Software", Research Disclosure, No. 348, Apr. 1993, Havant GB, p. 225.

P. Godefroid, "Using Partial Orders to Improve Automatic Verification Methods", *DIMACS Serial in Discrete Mathematics and Theoretical Computer Science*, vol. 3, 1991.

S. Katz, D. Peled, "Verification of Distributed Programs Using Representative Interleaving Sequences", *Distributed Computing*, vol. 6, pp. 107–120 (1992).

P. Godefroid, P. Wolper, "Using Partial Orders for the Efficient Verification of Deadlock Freedom and Safety Properties", *Formula Methods in Systems Design*, Kluwer Academic Publishers, vol. 2, No. 2, pp. 149–164, Apr. 1993.

A. Valmari, "A Stubborn Attack on State Explosion", *Formal Methods in System Design*, vol. 1, No. 4, pp. 297–322, 1990.

A. Valmari, "On–The–Fly Verification with Stubborn Sets", *5th Int'l Conf. on Computer Aided Verification,* Greece, 1993, Lecture Notes in Comp. Science, Springer–Verlag, 397–408.

*Primary Examiner*—Kevin J. Teska
*Assistant Examiner*—Russell W. Frejd

[57] ABSTRACT

An on-the-fly verification system which employs statically-available information to reduce the size of the state space required to verify liveness and safety properties of a target system consisting of asynchronous communicating processes. The verification system generates a verifier from a description of the target system and a specification of the property to be verified. The verifier models the target system as a set of finite state machines, constructs a state space containing a graph of nodes representing states of the target system and transitions between the states, and uses the state space to verify the property. The size of the state space is reduced by using information from the description and the specification to divide transitions from a node into per-process bundles and to determine which bundles of transitions must be included in the state space and which may be left out of the state space. The state space reduction technique never increases the size of the state space and often reduces it by orders of magnitude.

15 Claims, 15 Drawing Sheets

```
#define N        5              /* Number of Proc */
#define P       12              /* Numbers to check */
#define L        1              /* Size of buffer queues */
chan q[N] = [L] of {byte};

proctype left (chan out)        /* leftmost process */
{       byte counter;

        xs out;

        counter = 2;
        do
        : : out!counter ->              /* output value to the right */
                counter = counter + 1;
                if
                : : counter > p -> break
                : : counter <= p
                fi
        od
}
```

503

```
proctype middle (chan in, out; byte procnum)
{       byte myval, nextval;

        xs out;
        xr in;
        in?myval;               /* get first value from the left */
        do
        : : in?nextval;         /* upon receipt of a new value */
            if
            : : nextval % myval != 0 -> out!nextval
                        /* send number right if no divisor found */
            : : nextval % myval == 0
            fi
        od
}
```

```
proctype right (chan in) /* rightmost channel */
{       byte biggest, next;

        xr in;

        in?biggest;
        do
        : : in?next          /* ignore next values */
        od
}                                                           } 507

in  {
        byte proc=1;

        atomic {
                run left ( q[0] ) ;
                do
                : : proc < N ->
                        run middle ( q[proc-1] , q[proc], proc );
                        proc = proc+1
                : : proc == N -> break
                od;
                run right ( q[N-1] )
        }
}                                                           } 509
```

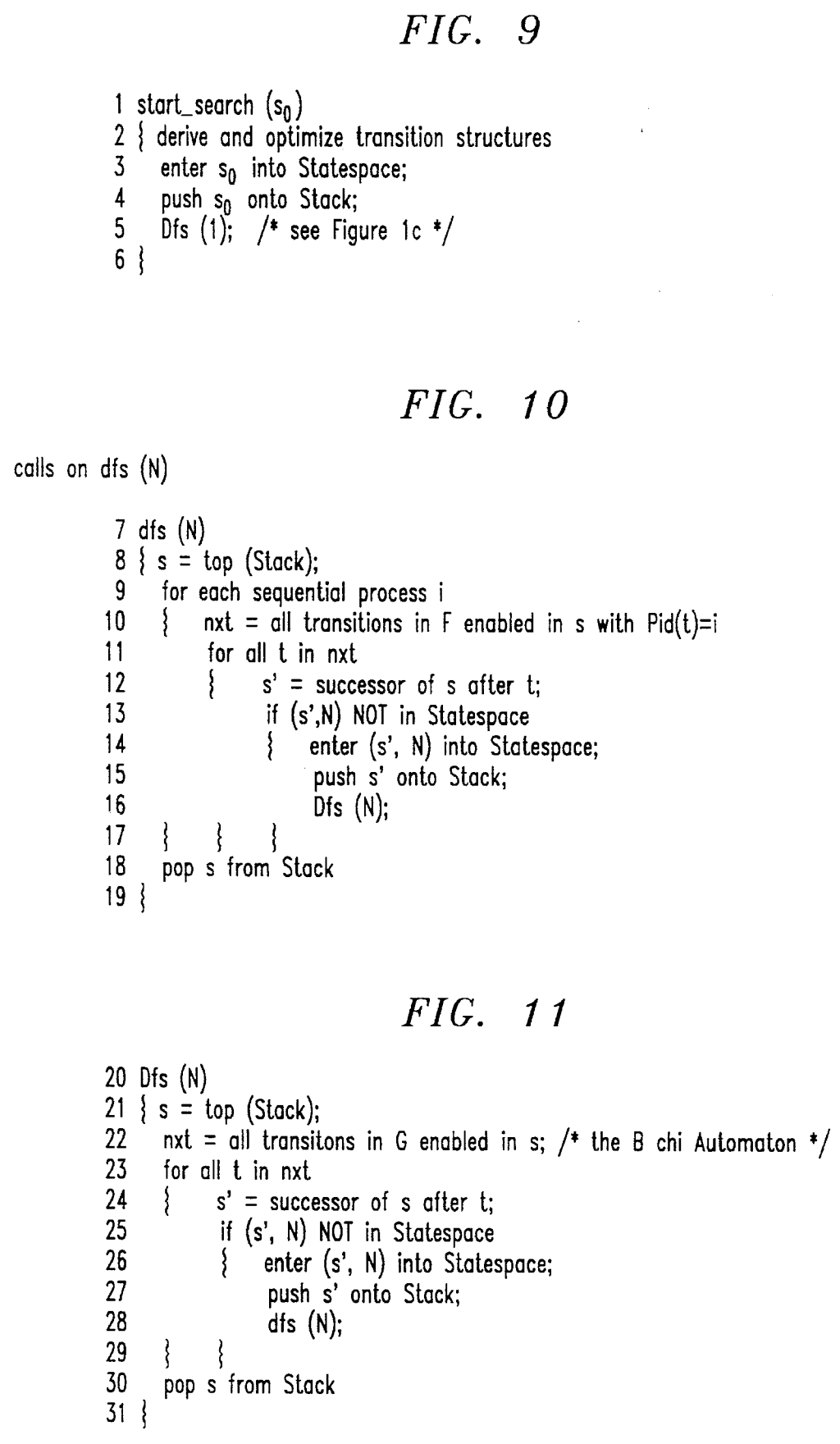

```
start_search (s0)
{ derive and optimize transition structures
  enter s0 into Statespace;
  push s0 onto Stack;
  Dfs (1);  /* see Figure 1c */
}
```

*FIG. 10* calls on dfs (N)

```
dfs (N)
{ s = top (Stack);
  for each sequential process i
  {   nxt = all transitions in F enabled in s with Pid(t)=i
      for all t in nxt
      {     s' = successor of s after t;
            if (s',N) NOT in Statespace
            {   enter (s', N) into Statespace;
                push s' onto Stack;
                Dfs (N);
  }   }   }
  pop s from Stack
}
```

*FIG. 11*

```
Dfs (N)
{ s = top (Stack);
  nxt = all transitons in G enabled in s; /* the B chi Automaton */
  for all t in nxt
  {     s' = successor of s after t;
        if (s', N) NOT in Statespace
        {   enter (s', N) into Statespace;
            push s' onto Stack;
            dfs (N);
  }   }
  pop s from Stack
}
```

FIG. 12

```
Dfs (N)
{ s = top (Stack);
  nxt = all transitons in G enabled in s; /* the B chi Automaton */
  for all t in nxt
  {     s' = successor of s after t;
        if N == 2 and s' == seed
        {   report acceptance cycle
            return
        }
        if (s', N) NOT in Statespace
        {   enter (s', N) into Statespace;
            push s' onto Stack;
            dfs (N);
            if N == 1 and s is an accepting state in G
            {   seed = s
                dfs (2)
            }
  }     }
  pop s from Stack
}
```

FIG. 13

```
dfs (N)
{ s = top (Stack);
  Re-order processes;
  for each sequental process i
  {     boolean Proviso = true
        nxt = all transitions in F enabled in s with Pid(t)=i
        for all t in nxt
        {     s' = successor of s after t;
              if (s', N) NOT in Statespace
              {   enter (s', N) into Statespace;
                  push s' onto Stack;
                  Dfs (N);
              } else if s' in Stack /* reduction proviso */
                  Proviso = false
        }
        if Proviso = true
            break /* from the loop over processes */
  }
  pop s from Stack
}
```

ON-THE-FLY MODEL CHECKING WITH PARTIAL-ORDER STATE SPACE REDUCTION

This is a Continuation of application Ser. No. 08/252,028 filed Jun. 1, 1994, now abandoned.

BACKGROUND OF THE INVENTION

1. Field of the Invention

The invention concerns techniques for verifying systems with concurrently-operating components and more specifically concerns verification of safety and liveness properties in such systems.

2. Description of the Prior Art

A feature of modern life is the large number of complex systems which must operate correctly. At one end of the spectrum, there are complex integrated circuits. These circuits can now implement whole computer systems. At the other end of the spectrum, there are world-wide communications networks. In between are control systems for medical devices, aircraft or power plants. As complex as these systems are, users expect them to work perfectly, and indeed, they do work well enough that a failure is news.

One way in which engineers have tried to deal with complex systems has been using verification tools to verify that the design for the complex system is correct. One large class of such tools works by modelling the complex system as a set of concurrently-operating components and verifying the model to make sure that the system exhibits properties such as safety and liveness. If the model has a safety property, the model will not do anything unreasonable; if it has a liveness property, it will eventually do something reasonable (for example, it will not hang).

An approach taken in many verification tools is to model the system as a bounded system of finite state components. A finite state component is one which can be modelled with a set of a finite number of states and state transitions. The model is verified by employing a computer program to analyze the reachable global states and their transitions to determine that there are no states or transitions which negate the desired property. The modelling may be done "on the fly", that is, a portion of a graph representing the states of the finite state components and their state transitions is generated dynamically while the states and transitions in the portion are analyzed as required to verify the property. An example of such an "on the fly" verification tool is SPIN, described in G. J. Holzmann, *Design and Validation of Computer Protocols*, Prentice-Hall, 1992.

"On the fly" verification tools such as SPIN are useful but are limited by the "state space problem." The state space of a model consists of the number of global states the model may have. With a model of any complexity, the state space becomes so large that even the largest computer systems do not have enough storage capacity and speed to make verification practical. In many cases, the verification could be done without searching many of the states in the state space. Eliminating such redundant states from the state space is termed reduction of the state space.

Until now, there has been no efficient technique for reducing the state space. Those active in the verification area have attempted a variety of dynamic reduction methods. These methods attempt to compute mostly at runtime (i.e., during the search) which pans of the reachability analysis are redundant and can be skipped. Unavoidably, the additional computations also consume resources: they require memory to store additional data structures, and they require CPU time to discover the redundancies. This overhead reduces the amount of improvement that can be achieved. In some cases, the costs of improvement outweigh the gains, which means that the unoptimized full search can sometimes outperform the 'optimized' reduced search.

What is needed, and what is provided by the techniques disclosed herein is a method for reducing state space which depends on static information, that is, information which is available prior to the search.

SUMMARY OF THE INVENTION

Reductions in state space are achieved by the techniques disclosed herein by finding transitions which may be included in the state space to the exclusion of all others while still provably permitting validation of liveness and safety properties. Since the other transitions are not included, neither are the states represented by their target nodes or any transitions which have their sources in those states, leading to an enormous reduction in the size of the search space.

The transitions which may be included in the state space while excluding others may be described as follows: Consider the set T of transitions of the program. For each program state S, Split that set into three disjoint subsets:

Dis(S) (from Disabled, these are the transitions that cannot be executed from S).

Sel(S) (from Selected, these are the enabled transitions that are selected by the reduction algorithm).

Ign(S) (from Ignored, these transitions are enabled from S, but are not selected).

It is sufficient for the preservation of liveness and safety properties if the depth-first search explores only the transitions in set Sel(S), provided that the following three conditions are satisfied.

C1: No execution sequence starting from S can exist in which a transition that is outside set Sel(S) and that is dependent on at least one transition in Sel(S)

becomes enabled without at least one transition from set Sel(S) having being executed first in that sequence.

C2: If Ign(S) is non-empty then no transition in Sel(S) can close a directed cycle.

C3: The execution of none of the transitions in set Sel(S) touches an object that is visible to the property being checked.

When a reduced state space is constructed by selecting transitions which fulfill the above conditions C1, C2, and C3, the reduced state space is never larger than a state space constructed by present methods and is often orders of magnitude smaller.

The foregoing and other objects and advantages of the invention will be apparent to one of ordinary skill in the art who peruses the following Drawing and Detailed Description, wherein:

BRIEF DESCRIPTION OF THE DRAWING

FIGS. 5A and 5B are a PROMELA description of the system of FIG. 4;

FIG. 9 is an initialization algorithm for state reduction;

FIG. 10 is an algorithm for an expansion step;

FIG. 11 is an algorithm which implements the expansion step for the transitions in the Buechi automaton;

FIG. 12 is an extension of the algorithm for detecting cycles; and

FIG. 13 is an algorithm for performing a reduced expansion.

Figure 1:
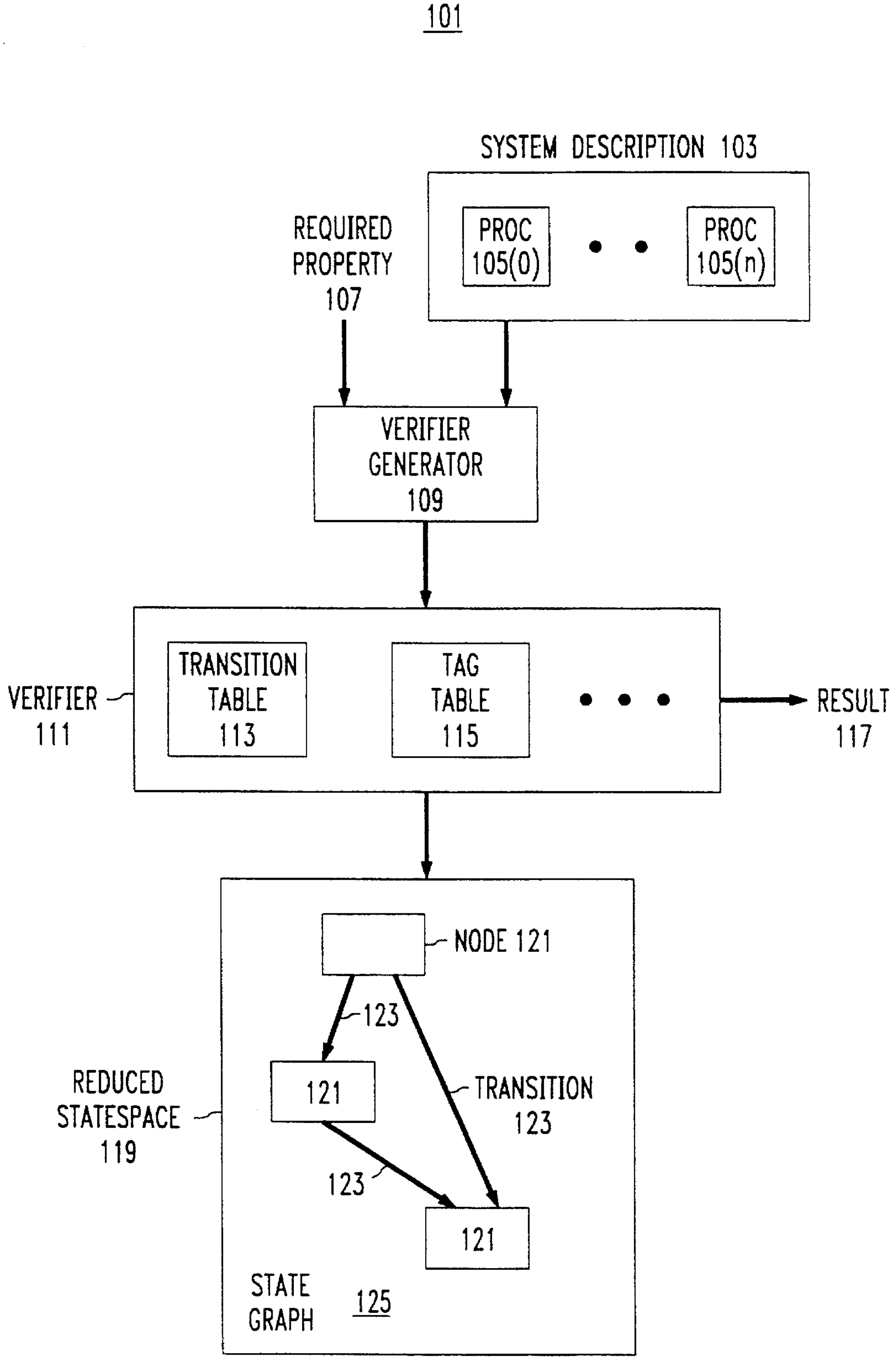
FIG. 1 is an overview of a verification system incorporating the invention.

The reference numbers employed in the Drawing and the Detailed Description have three or more digits. The two least significant digits are a number within a figure; the remaining digits are the figure number. Thus, the element with the reference number "305" is first shown in FIG. 3.

DETAILED DESCRIPTION

The following Detailed Description first presents an overview of the invention, then presents an example of its use, thereupon gives a formal description of the invention, and finally presents a generalization of the invention.

Overview of a Verification System Incorporating the Invention: FIGS. 1–3,7

FIG. 1 presents an overview of a verification system 101 which incorporates the invention. Verification system 101 takes as its inputs a system description 103 and a description of a required property 107 of the system of description 103. Description 103 describes the system being verified as a set of concurrently-operating asynchronous processes 105(0. . . n). The processes communicate with each other by means of synchronous and asynchronous message passing. In a preferred embodiment, system description 103 is written in PROMELA, described in detail in the Holzmann reference. Required property 107 and system description 103 are input to verifier generator 109, which then generates a verifier 111. Verifier generator 109 in the preferred embodiment is the SPIN model checker, which is described in detail in the Holzmann reference. The output of verifier generator 109 is a verifier program 111. When verifier program 111 is executed, it verifies whether the system described in system description 103 has required property 107 by performing a reachability analysis on states of the system of description 103. In the course of performing the reachability analysis, verifier 111 constructs reduced state space 119 which contains state graph 125. State graph 125 consists of nodes 121 specifying states of the system described in system description 103 and edges 123 describing transitions between the states of the nodes 121. The result of the verification, indicating whether the system of description 103 has the required property 107 is output at result 117.

Figure 2:
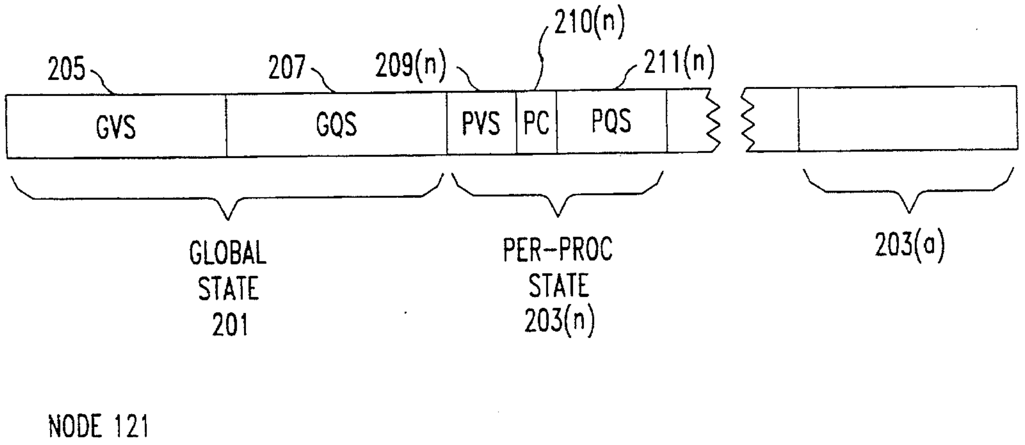
FIG. 2 is a detail of a node in the state space generated by the verification system.

FIG. 2 shows a detail of a node 121. Each node 121 has a global state portion 201 and a per-process state portion 203 for each process specified in system description 103. The global state portion includes the state of any global variables 205, i.e., variables which can be set and/or read by more than one process and the state of any global queues 207, i.e., queues which are shared between processes. Each per-process state portion 203 for a process 105(*n*) includes the state of any variables 209(*n*) local to the process, the state of the process's program counter 210(*n*), and the state of any queues 211(*n*) local to the process. As can be seen from the amount of information in a node 121, state graph 125 may have an enormous number of nodes. For example, if the system of system description 103 has 3 processes and no global state, each process can have ten different combinations of values in per-process state 203, and the combinations may occur in any order, then the potential number of nodes in the system is (10*10*10) or 1000 nodes, and of course most systems will have more processes and/or more states.

An important difference between system 101 and prior-art verification systems is that system 101 is able to use information obtained from system description 103 and the required property 107 to reduce the size of state space 119. In the preferred embodiment, the information is associated with state transitions. Verifier 111 includes a transition table 113 which is compiled from system description 103 and which lists all state transitions 123 which the system of system description 103 is capable of. Transition table 113 is shown in detail at FIG. 3. There is an entry TTE 203 for each state which is indexed by a transition number 201. Each entry describes an enabling condition (EC) 205 for the transition, for example a value of a variable or a state of a queue, and an action 207 to be taken on the transition.

Each entry in transition table 113 has a corresponding entry in tag table 115 which indicates the significance of the transition for state reduction. Each transition 123 belongs to one of three classes:

the transition is unconditionally safe;

the transition is conditionally safe; and the transition is unsafe.

It should be pointed out here that the use of safe in this context has nothing to do with the safety property of a system. How the safeness of a transition is determined from system description 103 will be described in more detail later.

The transitions in a node 121 are further bundled according to the processes 105 whose state is involved in the transitions. In a preferred embodiment, all of the transitions which change state belonging to a given process are bundled together. If the values in a node 121 permit one or more bundles of transitions 123 in which all of the the transitions are unconditionally safe, only the transitions in one of the bundles need be taken, and only the nodes 121 reached by those transitions need be included in reduced state space 119. If is a bundle in which all transitions are conditionally safe, the conditionally safe transitions can be treated as safe at run time. This is done by making run-time checks for the conditions of the safe transitions. If all checks are satisfied, the bundle of safe transitions can be treated in the same fashion as a bundle of unconditionally safe transitions. If there are no bundles of transitions which include only unconditionally safe transitions or conditionally safe transitions whose conditions are satisfied by the current state, then all of the transitions and their target nodes must be incorporated into graph 125.

Figure 7:
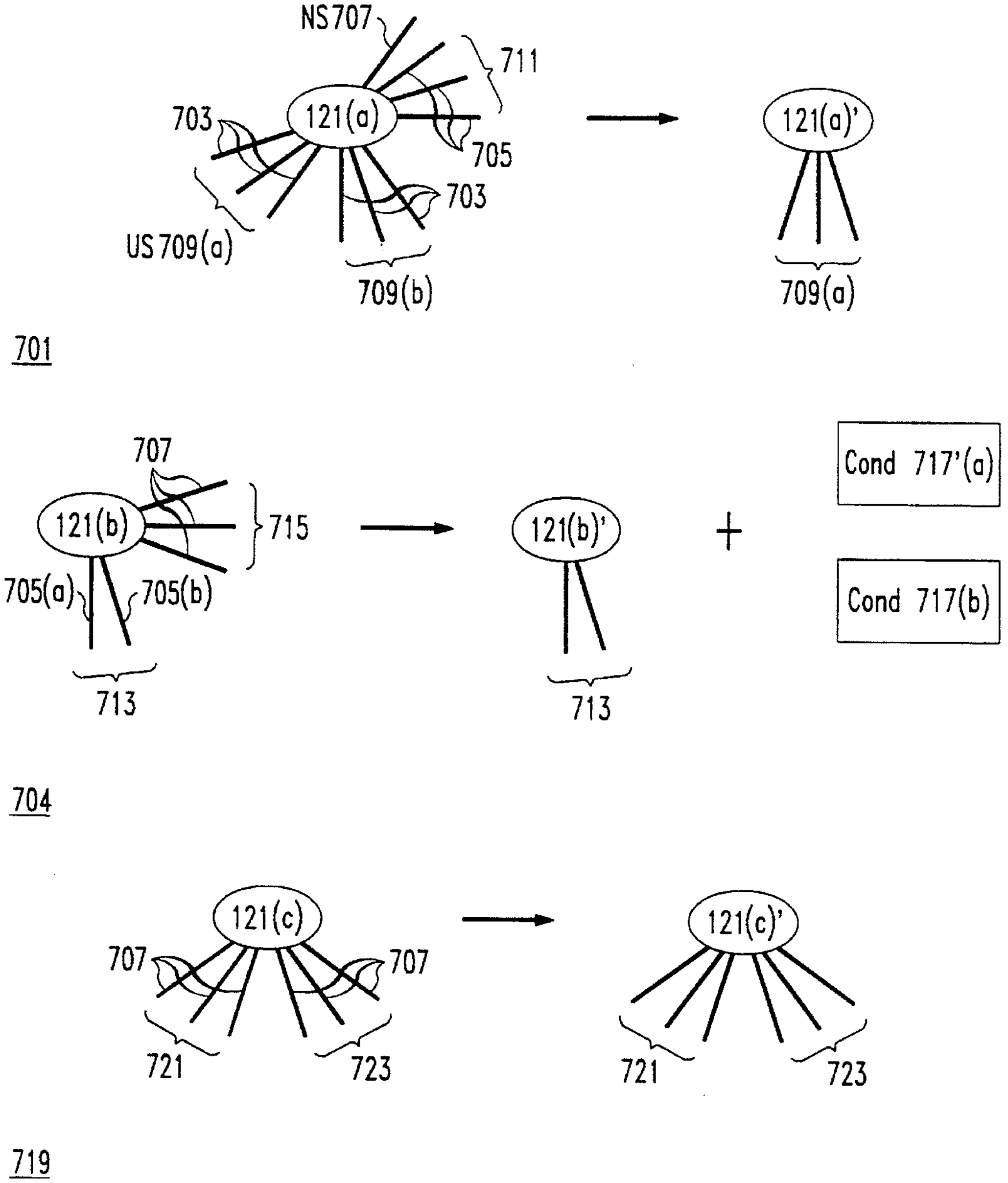
FIG. 7 shows how the state reduction technique reduces transitions from a node.

All of the above is shown in FIG. 7. At 701 in that figure, there is a node 121(*a*) which has two bundles 709(*a*) and 709(*b*), each of which includes nothing but unconditionally safe transitions 703, a third bundle 711, which contains conditionally safe transitions 705, and a fourth bundle consisting of a single unsafe transition 707. When the state reduction algorithm is applied, node 121 (*a*)' remains with only bundle 709(*a*) of unconditionally safe transitions 703. Similarly, there is shown at 704 a node 121(*b*) which has a bundle 713 of two conditionally safe transitions 705(*a*) and 705(*b*) and another bundle 715 of transitions 707 which are unsafe. If the conditions 717(*a*) and 717(*b*) applying to transitions 705(*a*) and 705(*b*) are satisfied when the state reduction algorithm is applied, node 121(*b*)' has only the transitions in bundle 713. Node 121(*c*), finally, has only bundles 721 and 723 which include unsafe transitions 707, and consequently, no state reduction is possible.

Figure 3:
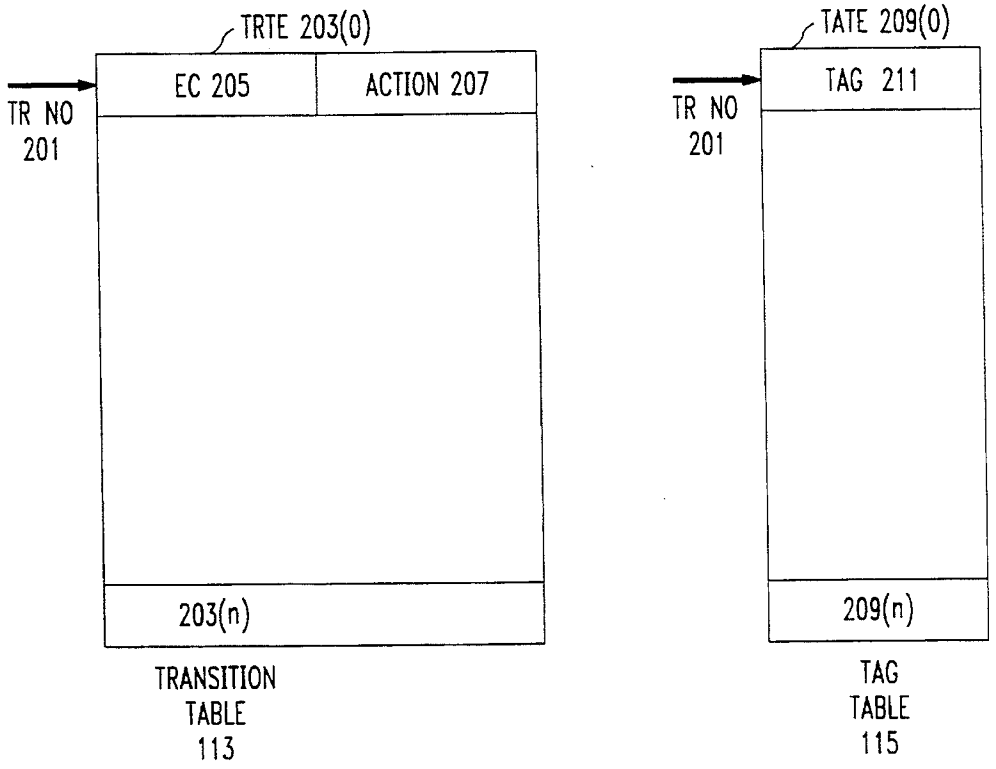
FIG. 3 is a detail of tables used in the verification system.

In a preferred embodiment, the safeness class of a transition is indicated in tag table 115. As shown in FIG. 3, there is an entry 209 in tag table 115 corresponding to each transition in transition table 113. Tag 211, the contents of the entry, indicates whether the corresponding transition is unconditionally safe, conditionally safe, or unsafe. In the case of a conditionally safe transition, tag 211 is a code which indicates what kind of run-time check must be made. In operation, verifier 111 checks tag table 115 for each transition and puts the reduced number of transitions 123 and nodes 121 permitted by the safeness properties of the transitions in state graph 125.

Figure 4:
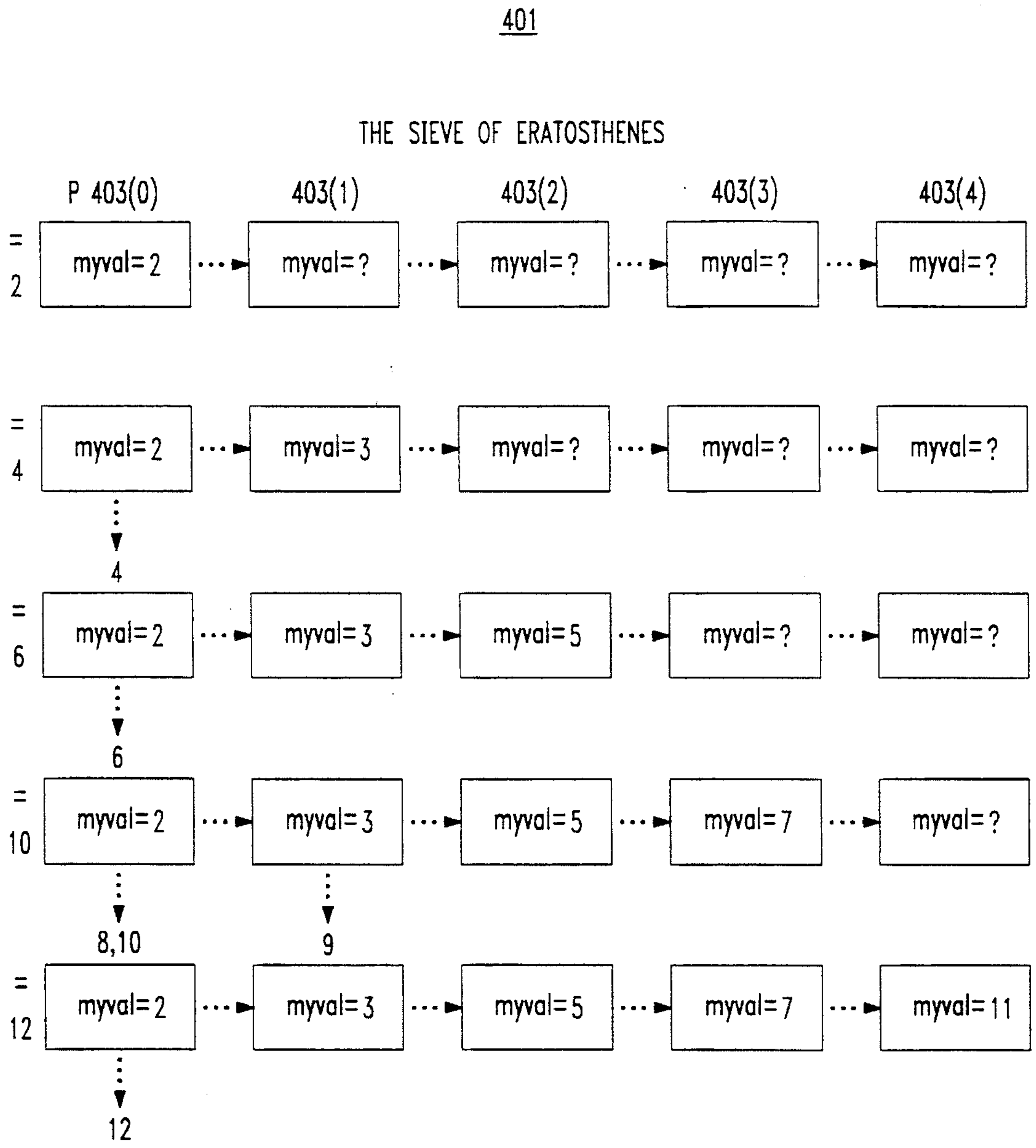
FIG. 4 is an example system which computes prime numbers according to the method of the sieve of Eratosthenes.
Figure 6A:
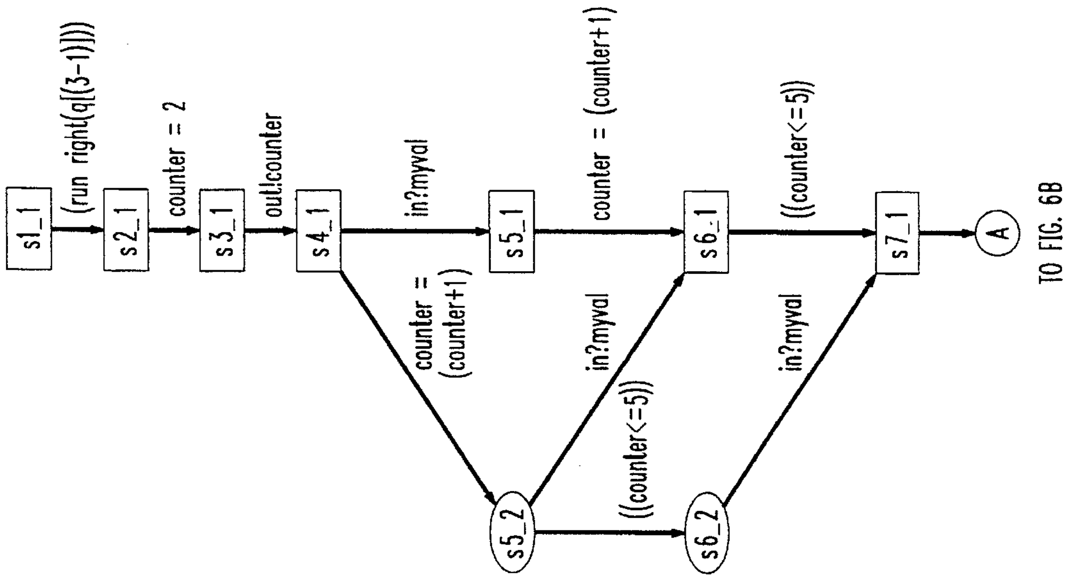
FIGS. 6A–6F show the reduction in state space achievable in the system of FIG. 4 by using the technniques of the invention.
Figure 6B:
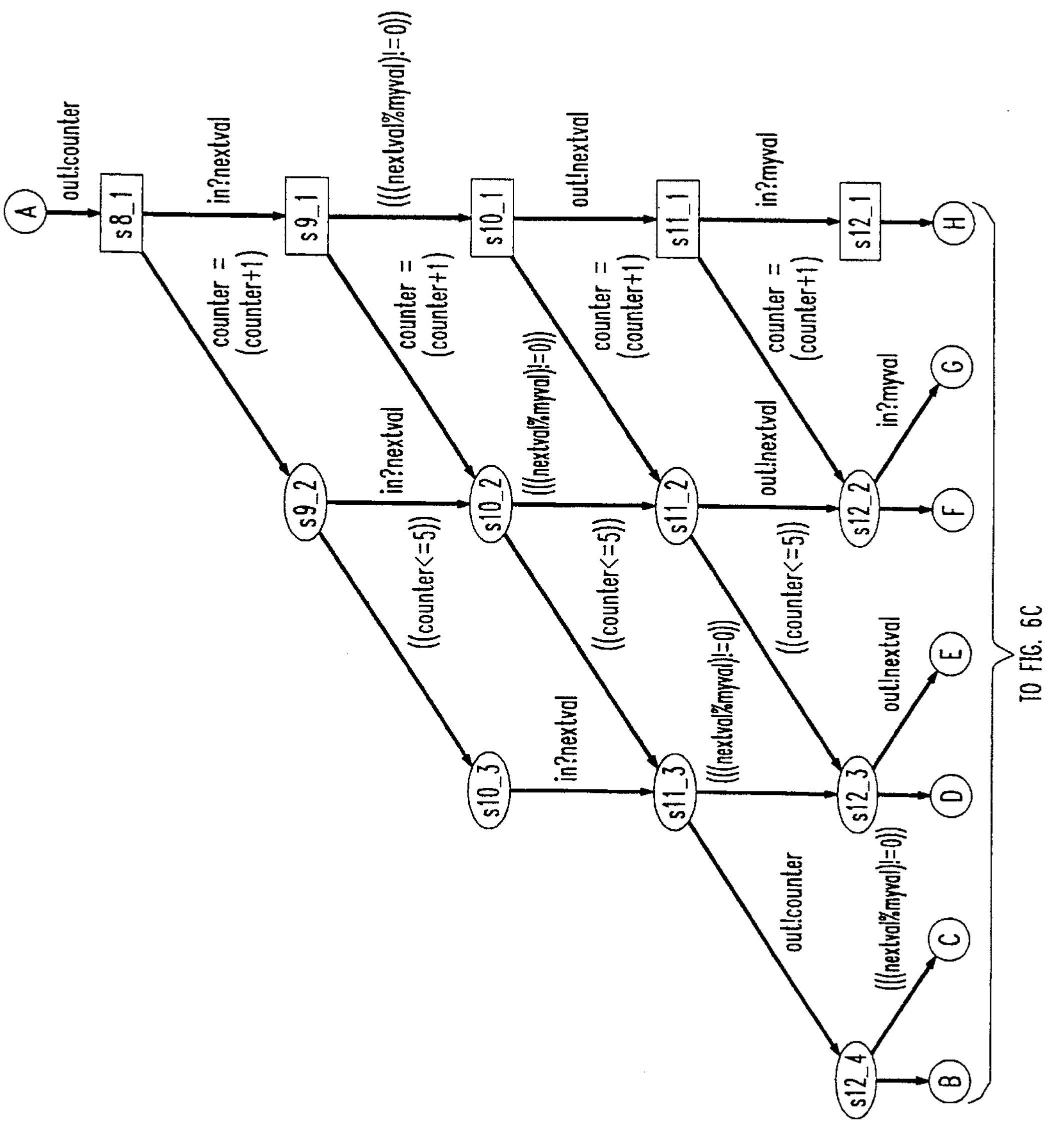
Figure 6C:
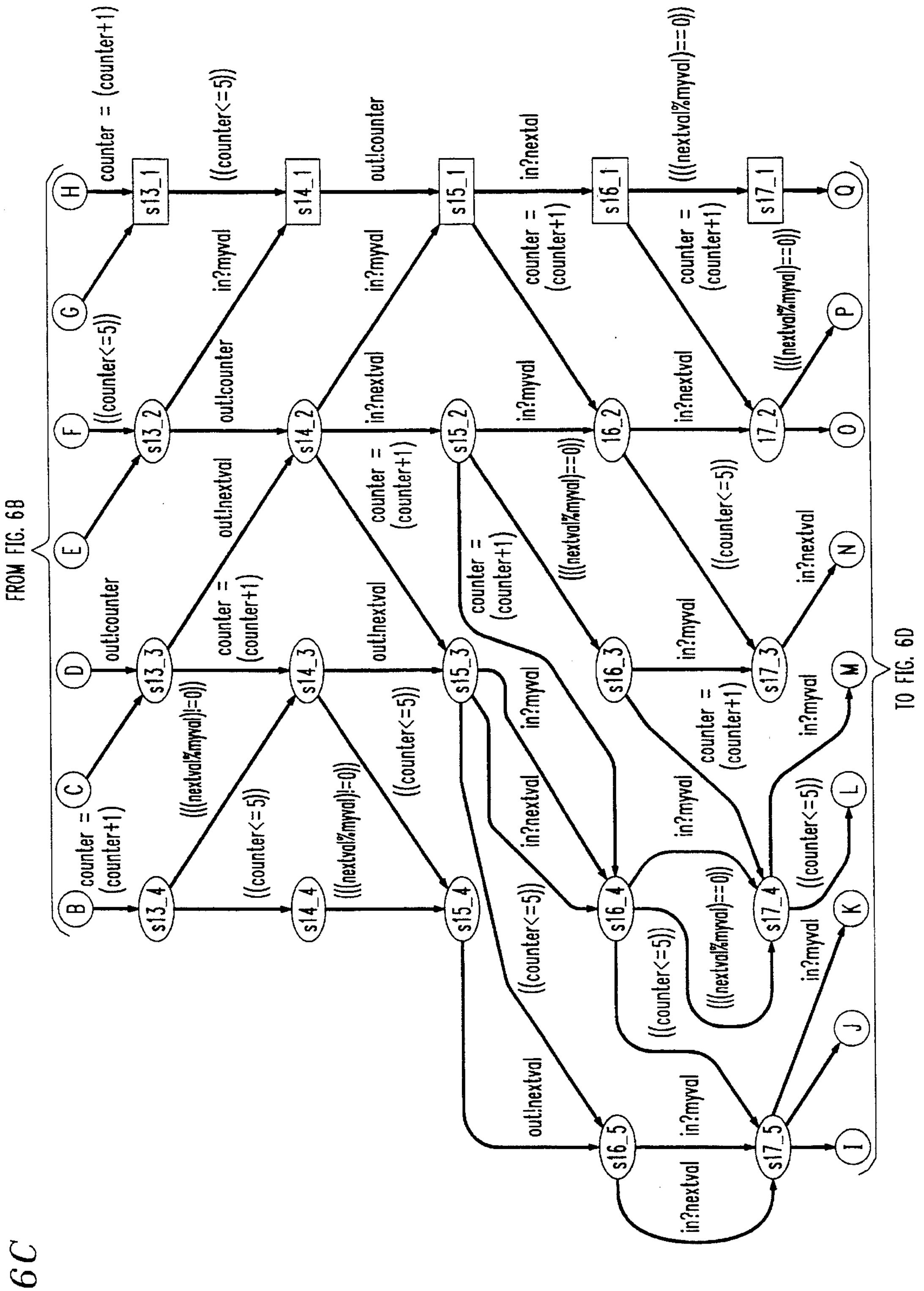
Figure 6D:
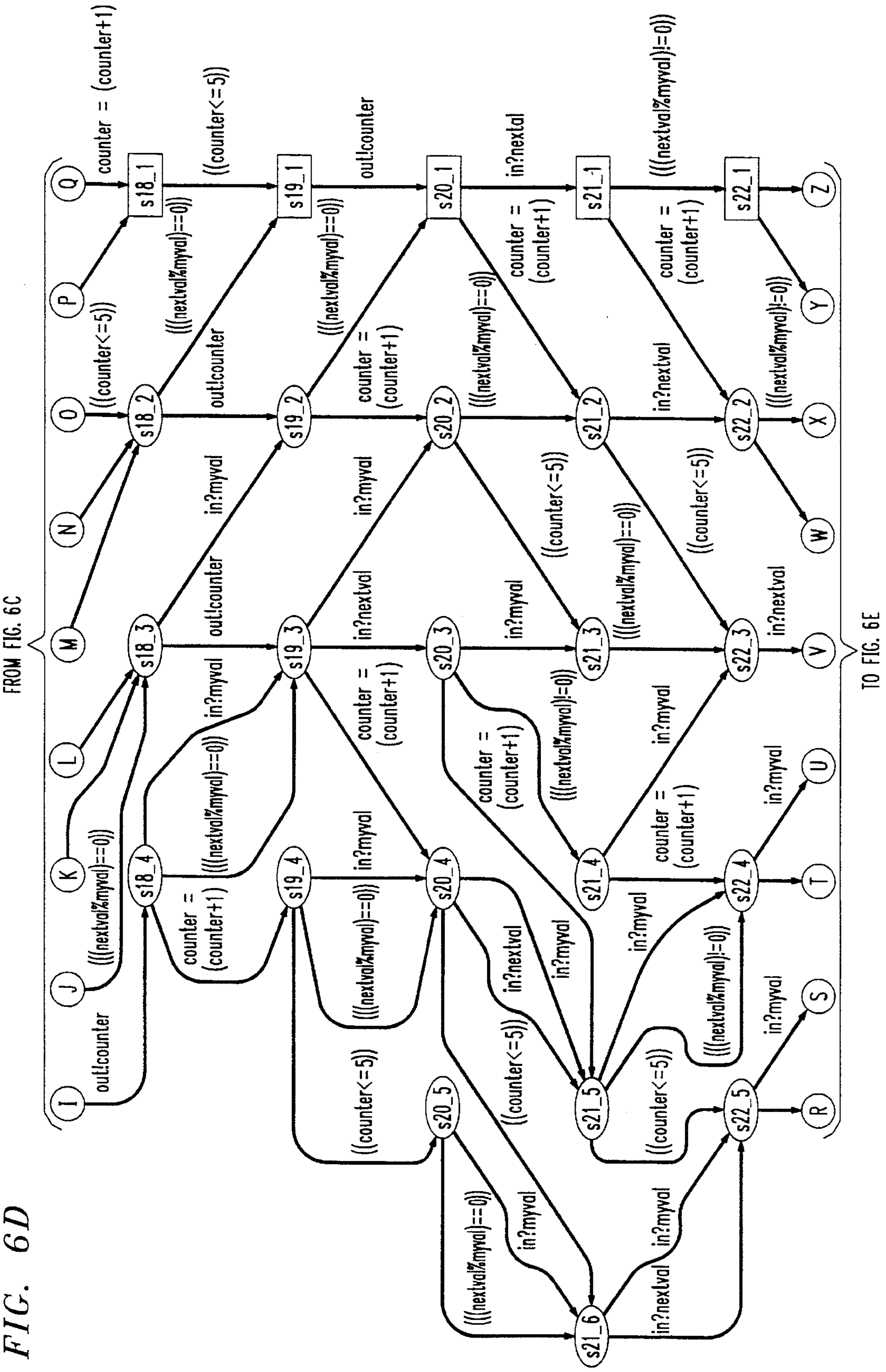
Figure 6E:
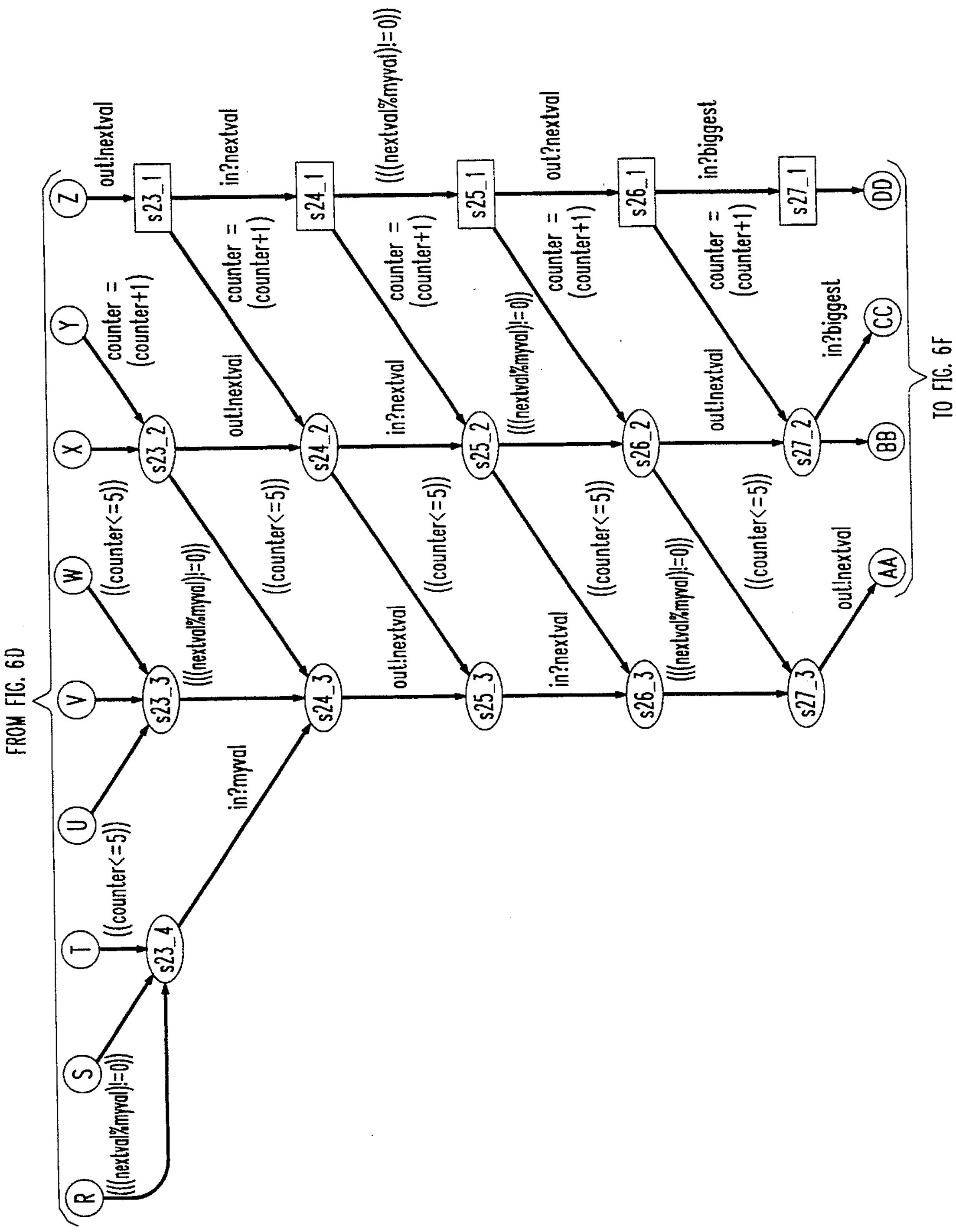
Figure 6F:
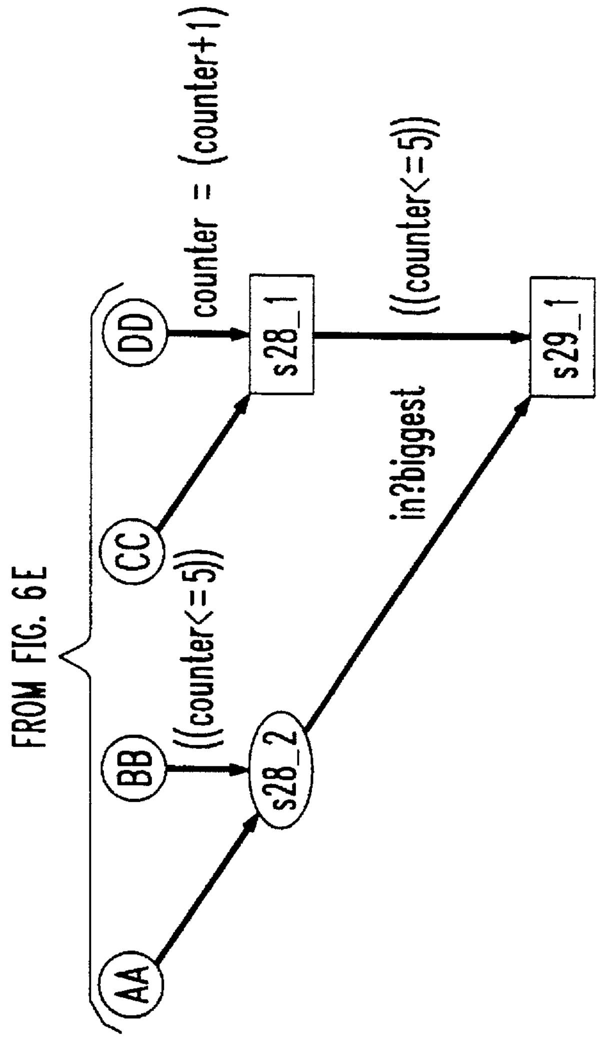

Example of State Reduction using System 101: FIGS. 4–6

A set of 6 processes which executes the classic algorithm called the sieve of Eratosthenes for finding prime numbers will serve as an example of how system 101 may be used to reduce the size of a state space. FIG. 4 shows how system 401 implements the algorithm. The system consists of five processes 403(0 . . . 4) plus a process (not shown) for providing the integers 2–12 in order. The prime numbers (integers divisible only by themselves and 1) in that sequence of integers are 2,3,5,7, and 11.

System 401 works as follows: each process 403 receives integers from the process on the left; each process stores the first integer it receives; from then on, it discards any integer which is divisible by its stored integer and passes any integer which is not divisible to the right. As shown in the first row of FIG. 4, when the integer N=2, none of the processes has a stored number, so process 403(0) stores the number in its local variable myval. The next number is 3. 3 is not divisible by 2, so as shown in the second row, process 403(0) passes 3 to process 403(1). This is the first value process 403(1) has received, so it stores the value in its local variable myval. The next number is 4. What happens with it is also shown in row 2. 4 is divisible by 2, so process 403(0) discards the value. The third row shows what happens when N=5. 5 is not divisible by 2, so process 403(0) passes it to process 403(1); 5 is also not divisible by 3, so process 403(1) passes it to process 403(2), which stores it. The remaining integers through 12 are treated in the same fashion. At that point, each process 403 has stored one of the prime numbers in the sequence 2–12.

As mentioned above, the system descriptions 103 used in a preferred embodiment are written in PROMELA. FIGS. 5A and 5B show a PROMELA description 501 for system 401. The description has four major components: init 509, right 507, middle 505, and left 503. Components 503 through 507 represent processes in system 401; left 503 is the process which provides the integers in increasing order; it has a single channel which outputs a value to process 403(0). middle 505 represents the processes 403 which receive values from the left and discard them or pass them to the right; each of these processes has two channels, one to its neighbor on the left and one to its neighbor on the right. right 507 represents the rightmost process 403. It has a single channel to its neighbor on the left.

init first creates and runs the process described by left 503; then init creates and runs processes described by middle 507 up to a maximum number established by a parameter N. In FIG. 4, these are the processes 403(0 . . . 3). Finally, it creates and runs the process described by right 507, process 403(4) in FIG. 4. In creating the processes 403, init sets up the channels for each process as described above.

As shown at 505, each middle process 403 stores the first value it receives. With each additional value, it divides the value by the stored value. If the division is even, the value is discarded; otherwise, it is passed to the right. As shown at 507, the right process simply stores the first value it receives and discards the rest.

The transitions of system 401 with which the example is primarily concerned are

- incrementing counter,
- receipt of a value from the left,
- sending a value to the right,
- testing the result of the division operation, and
- comparing the current value of counter with the maximum allowed value of the counter.

As will be explained in more detail later, all of the above transitions but those involving sending and receiving are local, in that the occurrence of the transition in one of the processes 403 has no effect on the other processes 403. With local transitions, it makes no difference whether one of the processes 403 performs a given local transition before or after another process 403. As will again be explained in more detail later, the local transitions are all unconditionally safe.

The transitions involving sending and receiving are conditionally safe, but in system 401, the conditions are always satisfied, and these transitions, too, are always safe. Since all of the transitions are always safe, that is the case, the state space can be reduced to the number of states required for each process 403 in turn to receive its first value, divide the next value by the first value from the left, and do nothing if the result is 0 and otherwise send the next value.

Figure 8:
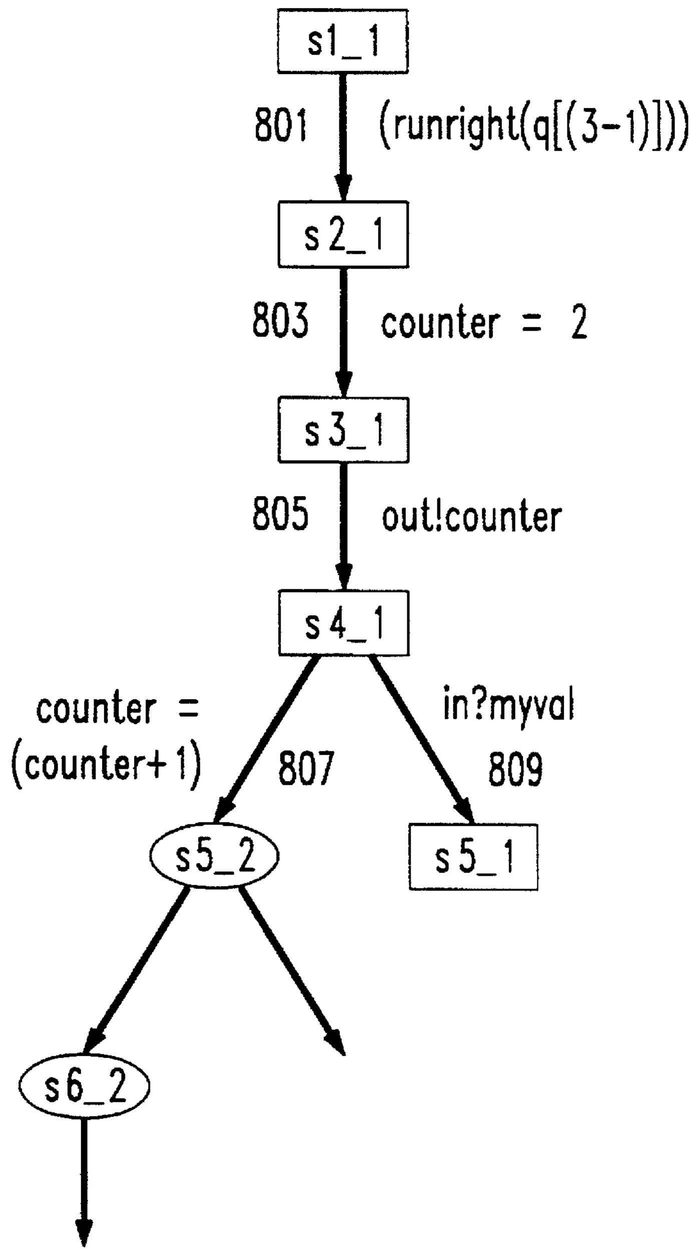
FIG. 8 is a detailed view of a portion of the state space of FIG. 6.

FIGS. 6A–6F show the results of the reduction. State space 601 is the states and transitions made by a version of system 401 which has three middle processes 403 and finds the primes through 5. States which remain in the reduced state space are shown as square nodes 605, while states which are not part of the reduced state space are shown as round nodes 603. FIG. 8 shows a detail of area 609 of FIG. 6. Each node 121 has been labelled with a name (s1-1, s2-1, etc.) and each transition 123 has been labelled to indicate what pan of the state of system 401 is affected by it. With transitions 801–805, there is only one transition 123 per node, and consequently, no state reduction is possible. With node s4_1, there are two transitions 123. Both are unconditionally safe and each transition involves a change of state in a different process 403. Consequently, each of the transitions is a bundle consisting of one transition and only one of the bundles needs needs to be included in the state space. Verifier 111 choses the bundle containing transition 809, and nodes 121 reachable by transition 807 need not be included in reduced state space 119.

Generalizing the Technique

As described above, the only characteristic of a transition 123 which is taken into account in determining whether a bundle is unconditionally safe, conditionally safe, or unsafe is the safeness class of the transition. That is sufficient to verify some specific safety properties of the system of description 103, for example, that the system will not deadlock. However, in order for the technique of the invention to be able to generally verify safety and liveness properties, three conditions must be met by all of the transitions in a bundle of transitions before the bundle is used to the exclusion of other bundles to generate reduced state space 119. The conditions may be described as follows:

Consider the set T of transitions of the program. For each program state S, Split that set into three disjoint subsets:

Dis(S) (from Disabled, these are the transitions that cannot be executed from S).

Sel(S) (from Selected, these are the enabled transitions that are selected by the reduction algorithm).

Ign(S) (from Ignored, these transitions are enabled from S, but are not selected).

It is sufficient for the preservation of liveness and safety properties if the depth-first search explores only the transitions in set Sel(S), provided that the following three conditions are satisfied.

C1: No execution sequence starting from S can exist in which a transition that is outside set Sel(S) and that is dependent on at least one transition in Sel(S)

becomes enabled without at least one transition from set Sel(S) having being executed first in that sequence.

C2: If Ign(S) is non-empty then no transition in Sel(S) can close a directed cycle.

C3: The execution of none of the transitions in set Sel(S) touches an object that is visible to the property being checked.

Condition C1 is a generalization of the requirement that all transitions in a bundle of transitions which are used to construct reduced state space 119 must be either unconditionally safe or conditionally safe. Condition C2 requires that no transition in the bundle return to a state 121 which is already in reduced state space 119 and which verifier 111 has not yet finished expanding, thereby forming a directed cycle in reduced state space 119. Condition C3 requires that one transition in the bundle may not alter a value which is mentioned in the property 107 being checked. All of these conditions are explored more rigorously in the following "Detailed Explanation".

Detailed Explanation of the Technique: FIGS. 9–11

The following explanation first presents a theoretical justification for the technique and then presents details of the technique. The technique applies generally to any problem which can be formalized as a reachability analysis problem in a finite labeled transition system (LTS). This specifically includes the problems of proving safety, liveness, and linear time temporal logic properties for any finite state concurrent system.

An LTS is defined as a triple $\{S,s_0,T\}$, where S is a finite set of states, $s_0$ is a distinguished initial state in S, and T is a finite set of transitions, with $T\subseteq(S\times S)$. In a simple form, an LTS can be used to formalize the behavior of a single sequential process. It can also formalize the combined behavior of a finite number of interacting and asynchronously executing sequential processes. Each transition of the LTS then corresponds to the execution of a specific atomic statement within one of the processes, in accordance with a standard interleaving semantics of concurrency. The LTS can be represented by a graph with nodes corresponding to the states in S and directed edges corresponding to the transitions in T. A connected path through this graph then defines the effects of a possible execution in the underlying concurrent system. There will be at least one path through the graph for every possible way in which the execution of process statements could be interleaved in time.

Given a transition $t\in T$ in an LTS, we will use the notation Label(t) to refer to the process statement that is represented by transition t, and we will use Pid(t) to refer to the sequential process that contains the statement Label(t). Without loss of generality, we assume that the mapping from transitions to process statements is unique. The reverse mapping will, in general, not be unique.

The semantics of a statement $\alpha$=Label(t) are defined by two functions Cond and Act, where Cond($\alpha$) is the subset of S where $\alpha$ is enabled (or 'executable' [H92]), and Act($\alpha$,s) is that state of S that is reached when $\alpha$ is executed in a given sÅCond($\alpha$).

Normally, a statement in a sequential process is 'enabled' or 'executable' only if it is pointed to by the current program counter of the sequential process that contains that statement. In a concurrent system, however, we can define additional constraints on the enabledness or executability of statements. A message send operation, for instance, can be defined to be enabled only if also the destination message buffer is non-full, and a message receive operation can be defined to be enabled when also the source message buffer is non-empty.

Two statements $\alpha$ and b are defined to be independent at state $s\in S$, written as $\{\alpha,b\}\in Ind(s)$, if and only if the following five conditions are met:

(1) $s\in Cond(\alpha)$, i.e., statement $\alpha$ is enabled in s, (2) $s\in Cond(b)$, i.e., statement b is enabled in s, (3) $Act(\alpha,s)\in Cond(b)$, i.e., the execution of $\alpha$ cannot disable b, (4) $Act(b,s)\in Cond(\alpha)$, i.e., the execution of b cannot disable $\alpha$, (5) $Act(b,Act(\alpha,s))=Act(\alpha,Act(b,s))$, i.e., the effect of executing $\alpha$ followed by b is indistinguishable from that of executing b followed by $\alpha$.

Note that two statements from the same sequential process, i.e., with Pid($\alpha$)=Pid(b), can not be independent. If the two statements are executed sequentially, they cannot be simultaneously enabled. If they appear together in a single selection, the execution of either one statement will disable the other. Two statements from distinct sequential processes can be independent under certain conditions. Two send operations on distinct message queues will in general be independent, but two send operations on the same message queue will not. The send operation that executes first may disable the second if its message fills the queue to capacity, which violates requirements (3) and (4). In addition, the order in which the two statements are executed can be distinguished by the order in which the messages appear in the destination queue, which violates requirement (5).

Statements $\alpha$ and b are defined to be globally independent if and only if they are independent in every possible state where they are simultaneously enabled:

$$(6)\ s\in(Cond(\alpha)\cap Cond(b))\rightarrow\{\alpha,b\}\in Ind(s).$$

Note that $\alpha$ and b are trivially globally independent when $Cond(\alpha)\cap Cond(b)=\emptyset$. Two assignment statements from two distinct sequential processes, i.e., Pid($\alpha$)≠Pid(b), that access only local variables within each process, will in general also be globally independent.

Because it is known that both safety and liveness properties can be expressed by next-time-free linear-time temporal logic (LTL) formulae, we will focus on a method for proving the satisfiability of LTL formulae. The LTL formulae we consider may contain boolean propositions on system-states, the boolean operators , , ! (not), and the temporal operators □ (always), ◇ (eventually), and U (until), but not the temporal operator ○ (next-time).

Wolper showed in Wolper, et al., "Reasoning about infinite computation paths", *Proceedings of 24th IEEE Symposium on the Foundations of Computer Science*, Tuscan, 1983, pp. 185–194, that any next-time-free LTL formula can be formalized as a nondeterministic Buechi Automaton with a predefined initial state, and a finite set of acceptance states. The transitions in the Buechi Automaton carry predicate labels, each of which represents a boolean proposition. In our case, the boolean propositions can refer only to the (global) system-state of the labeled transition system for which the LTL formula formalizes a property. The Buechi Automaton itself can be represented by an LTS with predefined acceptance states. The satisfaction of an LTL formula can now be proven by detecting acceptance cycles in the synchronous product of two labeled transition systems: one representing the concurrent system and one representing the Buechi Automaton. The absence of acceptance cycles can similarly prove that the LTL formula cannot be satisfied.

The synchronous product F×G of a labeled transition system F, representing a concurrent system, and a Buechi Automaton G, derived from a next-time-free LTL formula, is defined as follows. Let $F=(S_F,f_0,T_F)$ and $G=(S_G,g_0,T_G)$. Each state of the synchronous product F×G is a pair (f,g), with $f \in S_F$ and $g \in S_G$. Each transition, similarly, is a pair (v,w), with $v \in T_F$ and $w \in T_G$. We define the LTS for the synchronous product F×G recursively as follows. The initial state of F×G is $(f_0,g_0)$. For each state (f,g) there is a successor state (h,k), reachable via transition (v,w), if and only if:

(1) $v=(f,h) \in T_F$, i.e., h is a successor of f via v in F, (2) $w=(g,k) \in T_G$, i.e., k is a successor of g via w in G, and (3) The boolean proposition defined by Label(w) is true in state $f \in S_F$.

A statement α in F is said to be observable by Buechi Automaton G if there exists a label in G for which the corresponding proposition can have a different truth-value in at least one system-state s∈Cond(α) and in Act(α,s). The statement a can now be said to be Safe if α is non-observable to G and globally independent from every b with Pid(α)≠Pid(b), and Conditionally Safe for condition P(s), if α is safe in every state s where P(s) holds.

The reduction algorithm that we will describe in the next section relies on the fact that the safety or conditional safety of statements can in many cases be determined statically.

1. REDUCTION ALGORITHM

We first consider the standard depth-first search algorithm that implements the generation of the labeled transition system F from a specification of a concurrent system. We then consider how this search can be extended to generate the synchronous product F×G, where G is a Buechi Automaton that encodes an LTL formula, and to detect the existence of acceptance cycles in that product.

The initialization 901 of the search is illustrated in FIG. 9. First, the basic transition structure of the concurrent system is obtained and optimized. The optimization step, can, as we shall argue, also include a precomputation of independence relations, with a static identification of all safe and conditionally safe process-statements. Two sets of states are then initialized with the predefined initial system state $s_0$: the Statespace and the Stack.

The search begins with a call of the depth-first search routine, Dfs(), with parameter 1. The relevance of the parameter will become clear shortly. FIG. 10 first shows the expansion step for process statements, in routine dfs() (note: not the routine from line 5). In the absence of a Buechi Automaton, the calls on lines 5 and 16 could both be implemented as calls on dfs(N).

In the general version of the verification algorithm, however, the calls on lines 5 and 16 invoke the routine shown in FIG. 11, which implements the expansion step for the transitions in the Buechi Automaton. The state of the Buechi Automaton is part of compound system state s. Because the transitions in the Buechi Automaton represent boolean propositions from an underlying LTL formula, a transition $t \in T_G$ in B chi Automaton G will only be enabled if and only if proposition Label(t) holds. The synchronous coupling of system F and Buechi Automaton G is achieved by alternating the calls to Dfs(N), on line 16, and dfs(N) on line 28. Each pair of subsequent calls, explores one synchronous transition of F×G.

FIG. 11 shows only the basic expansion step without the extra hooks that are required to detect the presence of acceptance cycles in the synchronous product of concurrent system and Buechi Automaton. To enable also the detection of acceptance cycles, we can check for every reachable acceptance state in G if that state is also reachable from itself. We do so with a second depth-first search, in post-order, in a separate state space. Two separate values for parameter N serve to indicate in which part of the search the algorithm operates. To initiate the second search, we include four extra lines between lines 28 and 29 of FIG. 11, as illustrated in FIG. 12. If the seed state is reachable from itself this can be detected and reported at line 24, as illustrated by lines **24*a–d* in FIG. 12**.

A description, and correctness proof, for this method of cycle detection was given in [CVWY92]. The algorithm generates at least one example of an acceptance cycle, if one or more such cycles exist. It is not guaranteed to generate all such cycles. If, however, the Buechi Automaton is used to formalize an undesirable behavior, i.e., the violation of a correctness requirement, a proof of either the existence or the absence of acceptance cycles that satisfy the claim is always sufficient for a conclusive verification result.

Note that when the existence of an acceptance cycle is discovered, its complete traversal is contained in the Stack, and can be generated as a counter-example to the correctness Static Reduction claim.

To implement a static reduction technique, it suffices to modify only the algorithm from FIG. 10, since the safety of transitions applies only to the transitions in the sequential processes, not to those of the Buechi Automaton. The change is illustrated in FIG. 13. The aim of the reduction method is to find the smallest set of transitions that will suffice to perform the expansion (given that we want to preserve both safety and liveness properties). Clearly, the expansion cannot be complete unless for every transition selected, we also select all those simultaneously enabled transitions that that are not independent from it. This means that if we select α, we must minimally also select all simultaneously enabled transitions b with Pid(b)=Pid(α) (cf. line 10 in FIG. 13).

In the static reduction method we try to identify at least one process that can execute only safe, or conditionally safe, transitions. Such a process can be found by a prescan of the processes. In FIG. 13, this critical step is performed on line **8*a* and is used to re-order the processes in such a way that processes that perform only (conditionally) safe transitions can be selected first for the expansion step on line 9. If the expansion succeeded (more about this below) we can ignore the (independent) transitions from all other processes by breaking out of the loop over processes on line 16*f*.** The ordering step itself introduces virtually no runtime overhead. In the implementation discussed in Section 5, for instance, it is implemented by a table-lookup for unconditionally safe transitions, and by the evaluation of a precomputed boolean condition for conditionally safe transitions.

A check is added on lines **16*a–b*, to see if the last transition explored returned the search to a state s' that is already contained in the search stack or not. If there is at least one such transition, the value of a local boolean variable NotInStack is set to false. Once all transitions of the process have been explored, the values of NotInStack and AtLeastOneSuccessor are inspected. The reduction attempt fails unless all transitions explored for the current process have produced successor states that are currently not contained in Stack. If this requirement is not met, the algorithm will try to make another selection of transitions, by moving to the next process in the outer for-loop. In the worst case, this will mean that the reduced expansion step will explore all enabled transitions, just as it did in FIG. 10**.

The condition on line **16*e*** that has to be fulfilled for the reduction attempt to be considered successful is known as the reduction proviso. The need for such a proviso was first recognized by Valmari in [V90]. The version of the proviso used here was first proposed in [P93]. A weaker version of the same test, for the preservation of safety properties only, was discussed in [HGP92]. In the next section we will show that the stronger proviso from [P93] guarantees the preservation of both safety and liveness properties.

The tests on line **16*a* and 16*e*** introduce virtually no overhead to the algorithm.

2. PROOF OF CORRECTNESS [skip on first reading]

We will give the main proof argument that supports the correctness of the reduction algorithm. The remaining steps that are required for a rigorous proof are only briefly indicated.

An execution sequence σ of an LTS can be defined either as a sequence of transitions or as the sequence of states that is traversed by these transitions. Let Eq(σ) be the set of all execution sequences that can be obtained from σ by zero or more permutations of adjacent, globally independent, transitions. For each sequence in this set we can define the distance to σ as the smallest number of permutations that must be performed to retrieve σ. (This distance can be eithe finite or infinite.)

Any sequence ρ that equals a finite prefix of at least one sequence in Eq(σ) is called a permuted prefix of σ. Let PP(ρ,σ) be the set of sequences in Eq(σ) that contain ρ as a prefix. Let PP'(ρ,σ) further be the subset of those sequences in PP(ρ,σ) that have the shortest distance to σ. Note that the sequences in this set differ from σ in at most a prefix of finite length. For each such sequence, therefore, we can define a finite prefix ρ', such that the remainder of the sequence (after the deletion of ρ') equals σ. This prefix, which can be longer than ρ, is called the minimal stable extension of ρ in σ.

A generalized permuted prefix ρ of an execution sequence σ is finite execution sequence that can be transformed into a permuted prefix of σ by omitting zero or more non-observable transitions.

To prove the correctness of the reduced search algorithm, we first prove the following Lemma.

Lemma—At each state that is reached during the search, the reduced search algorithm generates at least one generalized permuted prefix ρ for every execution sequence σ that can start from that state.□

Proof—The proof is by induction on the order in which states are removed from the depth-first stack in the reduced search algorithm.

[1.] For the induction basis, consider the first state that is removed from the stack in the reduced search algorithm. There are two cases to consider, depending on the number of enabled transitions in that state.

[1.1.] The state has no enabled transitions, and thus no successor states. In this case there exist no further executions from this state, and the Lemma holds.

[1.2.] The state has enabled transitions. All these transitions must have returned the search to previously visited states: they cannot be new states because such states would have been removed from the stack before the current one. Since no states were previously removed from the stack, all previously visited states are still contained in the stack. The reduction proviso from the reduced search algorithm will in this case force a complete exploration of all enabled transitions from this state (line **16*a*, FIG. 13**). This set includes the first transition αfrom σ. This transition α is a generalized permuted prefix of length one. The Lemma therefore holds for this case.

[2.] Next, we must show that if the Lemma holds for the first N states that are removed from the stack, it necessarily also holds for the (N+1)-th state. Let s be that state. There are again two cases to consider.

[2.1.] The set of enabled transitions in s does not contain a true subset of (conditionally) safe transitions that includes all the enabled transitions for one sequential process, and none of which leads to a successor state on the stack. In this case, the reduced search algorithm explores all enabled transitions from s and the Lemma holds by the same construction as was used in the proof of step [1.2].

[2.2.] The set of enabled transitions in s does contain a true subset of (conditionally) safe transitions that includes all enabled transitions for one sequential process, and none of which leads to a successor state on the stack. Call that subset χ, and call the (non-empty) set of all remaining transitions y. The reduced search algorithm explores only the sequences that start with a transition from χ.

First note that any transition in χ forms a generalized permuted prefix of length one for σ. That is: each such transition either appears in σ after a finite number of globally independent transitions, or it does not appear in σ and is globally independent of all transitions that do appear.

There are two cases to consider.

[2.2.1.] If σ starts with a transition from χ, the Lemma again holds.

[2.2.2.] Next, consider the case where σ starts from state s with a transition from y and reaches successor state s'. We distinguish two further sub-cases.

[2.2.2.1.] First, consider the case where σ starts with a transition from y and where that transition is globally independent of all transitions in σ. In this case, none of the transitions in σ can have been disabled by the execution of the globally independent transition from y, and the transition itself forms a generalized permuted prefix of length one. The transition from y is now itself a non-observable transition that could be deleted from generalized permuted prefix to obtain the (empty) permuted prefix of σ. The Lemma therefore holds for this case.

[2.2.2.2.] Next, consider the case where σ starts with a transition from y and where that transition is not globally independent of all transitions in σ. Let α be the first transition in σ, and b a transition from the chosen set χ that appears also in σ. (The case where b does not appear in σ was already covered in the second half of proof step [2.2.].)

Call s' the state that is reached after the execution of b. We can now find a minimal stable extension of b in σ, as defined above, which includes all the occurrences of transitions in the prefix of σ that ends at the first occurrence of b. Call that prefix ρ. Further, call σ' the suffix of σ that follows first occurrence of b. Then the sequence ρ.σ' is equal to a copy of σ from which this first occurrence of b is deleted. The prefix ρ is then a generalized permuted prefix of the sequence ρ.σ' that starts at state s'. But then, the prefix b.ρ must be a generalized permuted prefix of σ, which starts at state s, which means that the Lemma also holds for this case. This completes the proof of the Lemma. □

The Lemma can be shown to imply that for every execution sequence σ, the reduced search algorithm explores at least one execution sequence that becomes equivalent to σ when a finite number of non-observable transitions are deleted from it. (This proof step is not detailed here.) Next we must show that this property is sufficient for the completeness of the search itself. To do this, we must take a closer look at the synchronous product of a concurrent system and a Buechi Automaton.

Given a concurrent system C and a Buechi Automaton M, we can construct an ordered set of predicates P(M) with one predicate for each boolean proposition on the states of C that appears in M. For each reachable system state of C, each predicate in P(M) then uniquely defines a boolean value, and the set P(M) similarly defines a unique vector of boolean values. For given P(M), an execution sequence of C corresponds to a sequence of boolean value vectors. Call that sequence 'the vector-sequence induced by M.'

We define two execution sequences to be M-equivalent, for given Buechi Automaton M, if and only if the corresponding vector-sequences induced by M are equal up to stuttering, i.e., if the two sequences are equal when each series of two or more consecutive occurrences of the same value vector ν is replaced by a single occurrence of ν.

The Lemma implies that the reduced search algorithm generates at least one M-equivalent sequence for each execution sequence of the concurrent system. The intuition for this is that all non-observable transitions correspond to stuttering steps. (This proof step is not further detailed here.) The correctness of the reduced search algorithm can now be formalized in the following theorem.

Theorem—If there exist acceptance cycles in the synchronous product of a Buechi Automaton and a concurrent system, the reduced search algorithm will detect at least one of these cycles.□

Proof—by the Lemma and the fact that the set of sequences satisfying a next-time-free LTL formula is closed under stuttering [L83]. The reduced search generates at least one M-equivalent sequence for each complete sequence that satisfies the LTL formula. All sequences that satisfy the LTL formula are detected in the non-reduced depth-first search as acceptance cycles in the synchronous product of the corresponding Buechi Automaton and the concurrent system (e.g., [W83][CVWY92][H92]). Therefore, if at least one M-equivalent sequence for such a satisfying sequence is generated in the reduced search, at least one acceptance cycle is necessarily detected.□

3. IMPLEMENTATION

For a sample implementation of the static reduction technique in the verification system SPIN and its specification language PROMELA [H92], we identified five types of statements that can be marked statically as unconditionally safe when they appear separately, and conditionally safe when they appear as guards in selection structures.

1. Any access to exclusively local variables. Any atomic process-statement that reads or writes exclusively objects that are non-observable to other processes, is also non-observable to the PROMELA never claim (which formalizes the Buechi Automaton).

2. Any receive operation on a message queue q, provided that no more than one process can either receive messages from q or test the contents or length of q. We mark such a queue with a special status: exclusive receive-access. Exclusive receive-access implies that a never claim contains no propositions on the contents of q.

3. Any send operation on a message queue q, provided that no more than one process can send messages to q, or test the contents or length of q. We say that such a queue has exclusive send-access. Exclusive send-access implies that a never claim contains no propositions on the contents of q.

4. The boolean test nfull(q), that returns true when message queue q is currently non-full, and false otherwise, provided that the statement is performed by a process that has exclusive send-access to that queue.

5. The boolean test nempty(q), that returns true when message queue q is currently non-empty, and false otherwise, provided that the statement is performed by a process that has exclusive receive-access from that queue.

The statements of types (1)–(5) are conditionally safe if they do appear as guards in selection structures. The condition for the conditionally safe statements is defined as the logical and combination of the following clauses for each type of guard: (1) true (i.e., these statements contribute no additional constraints), (2) and (5) nempty(q), and (3) and (4) nfull(q). Note that statements of type (2–5) can only contribute constraints of two statically determined types.

We extended the PROMELA grammar with the two new primitives nfull() and nempty(), referred to in (4) and (5). A simple grammar rule in the parser prevents attempts to include negations of these two tests.

The observability of the effect of statements to the propositions of the Buechi Automaton (i.e., the PROMELA never claim) is already guaranteed by the scope rules of PROMELA: in the absence of remote referencing, the never claim can only refer to global objects in the specification. All safe and conditionally safe operations are therefore necessarily non-observable to the claim. Any reference to a queue, for instance, breaks the exclusive access status of that queue, and automatically marks the send or receive operations as observable, and therefore non-safe.

Because PROMELA allows the dynamic creation of a finite number of processes, it is not always possible to determine a priori which processes will be able to access which queues. Exclusive send and receive access, in our implementation, is therefore entered into the PROMELA specification as a logical assertion, which can be checked at runtime. The Appendix shows an example of a complete PROMELA specification for a leader election protocol from [DKR82], with the exclusive send and receive assertions added. It can easily be shown that the validity of an assertion of this type can be proven by both the non-reduced and the reduced search, even when the reduction is based on an invalid assertion of this type. The intuition behind this is that the reduced search can only permute globally independent statements, it cannot prevent their execution alltogether. Therefore, at least one send or receive operation that violates an exclusive access assertion will eventually be executed in the reduced search, though perhaps at a different place then in the non-reduced search. There is, of course, also the possibility that the reduced search is stopped on the detection of an acceptance cycle before the violation of an exclusive access assertion can be demonstrated. In that case, however, the search has already reached its goal: it has detected the existence of at least one error (i.e., an acceptance cycle). If the violation of an exclusive access assertion can be demonstrated first, our implementation also reports an error (i.e., an assertion violation), which in that case means that the reduction itself was invalid.

For the correctness of the reduction algorithm itself it must be demonstrated that if there exist one or more acceptance cycles in F×G, the reduced search algorithm will always report at least one of them. The proof of this property is given in [P94]. Note that it is not guaranteed, neither for the reduced nor for the standard algorithm, that all acceptance cycles are reported.

Conclusion

The foregoing Detailed Description has disclosed to those of ordinary skill in the system verification arts how the state space required to verify liveness and/or safety may be reduced using statically available information. While the Detailed Description has disclosed the best mode presently known to the inventors of practicing the principles of the invention, it will be immediately apparent that many other implementations which employ the principles of the invention are possible. That being the case, the foregoing Detailed Description is to be regarded as being in all respects illustrative and exemplary, and not restrictive, and the scope of the inventions disclosed herein is to be determined solely by the claims as interpreted with the full breadth permitted by the patent laws.

What is claimed is:

1. A method implemented in a computer system of verifying that a system being analyzed has a safety or liveness property, comprising the steps performed in the computer system of:

using statically-available information to substantially reduce the work required to compute a state space describing the system being analyzed by computing a reduced state space of the system by eliminating redundant states of the system, the reduced state space still provably permitting verification of the safety and liveness properties; and using the reduced state space to verify the safety and liveness properties.

2. The method set forth in claim 1 wherein:

the step of using statically-available information further comprises the steps of:

for each transition from a given state of the system being analyzed statically making a safeness classification of the transition which at least classifies the transition according to whether the transition is unsafe and employing the classification to compute the reduced state space.

3. The method set forth in claim 2 wherein:

the step of making a safeness classification further classifies the transitions which are not unsafe according to whether the transition is unconditionally safe or conditionally safe, the conditionally safe transitions being safe if checks are made at runtime.

4. The method set forth in claim 2 or 3 wherein:

the system to be analyzed includes one or more asynchronous processes and the step of making a safeness classification further includes determining for each transition a process whose state is changed thereby and bundling the transitions by safeness classification and process and the step of employing the classification to compute the reduced state space includes the steps of determining whether there is more than one bundle for a given safeness classification and process which indicates that the transitions are not unsafe; and if there is more than one such bundle, defining the reduced state space as the state space corresponding to fewer than all of such bundles.

5. The method set forth in claim 4 wherein:

the step of defining the reduced state space defines the reduced state space as the state space corresponding to a single one of such bundles.

6. The method set forth in claim 4 wherein:

the step of making a safeness classification further determines whether a transition is not unsafe by performing the step for each of the transitions in the single one of the bundles of determining whether there is an execution sequence starting from the state to which the transition belongs which includes a transition that is not in the bundle and is dependent on a transition which is in the bundle and becomes enabled prior to execution of at least one transition that is in the bundle and if there is, determining that the transitions in the bundle are unsafe.

7. The method set forth in claim 6 wherein:

the step of making a safeness classification further includes the step of determining whether there is a bundle for the process other than the single one of the bundles; and if there is and there is a transition in the single one of the bundles which closes a directed cycle, determining that the transitions in the bundle are unsafe.

8. The method set forth in claim 7 wherein:

the step of making a safeness classification further includes the step of determining whether executing any of the transitions in the bundle touches an object which is visible to the property being verified and if that is the case, determining that the transitions in the bundle are unsafe.

9. The method set forth in claim 4 wherein:

the step of making a safeness classification further includes the step of determining whether there is a bundle for the process other than the single one of the bundles; and if there is and there is a transition in the single one of the bundles which closes a directed cycle, determining that the transitions in the bundle are unsafe.

10. The method set forth in claim 9 wherein:

the step of making a safeness classification further includes the step of determining whether executing any of the transitions in the bundle touches an object which is visible to the property being verified and if that is the case, determining that the transitions in the bundle are unsafe.

11. The method set forth in claim 4 wherein:

the step of making a safeness classification further includes the step of determining whether executing any of the transitions in the bundle touches an object which is visible to the property being verified and if that is the case, determining that the transitions in the bundle are unsafe.

12. An improved system verification tool which is implemented in a computer system including a processor and memory means, the verification tool being of the type wherein the system is modelled as a bounded system of finite-state components and a program executing on the processor employs a state graph of global states and state transitions of the system in the memory means to verify that the system has a given property, the improvement comprising:

a structure in the memory means which associates a safeness classification with each state transition, the safeness classification indicating at least whether the state transition is unsafe; and wherein the program employs the structure to determine whether states arrived at via a given state transaction need be added to the state graph.

13. The system verification tool set forth in claim 12 wherein:

the safeness classification further indicates whether translations which are not unsafe are unconditionally safe or conditionally safe, the conditionally safe transitions being safe if checks are made at runtime.

14. The system verification tool set forth in claim 13 wherein:

the finite state components of the system are processes; and the safeness classification further indicates for each transition the process whose state is changed thereby; and the program further employs the structure to determine whether there is more than one set of transitions for a given safeness classification from a state, all of the transitions in the set involving state for a single process, and if there is more than one such set, adding states to the state graph for fewer than all of the sets.

15. The system verification tool set forth in claim 14 wherein:

the program adds states to the state graph for only one such set.

* * * * *